United States Patent
Wicht et al.

(10) Patent No.: US 6,466,500 B2
(45) Date of Patent: Oct. 15, 2002

(54) AMPLIFIER CIRCUIT

(75) Inventors: Bernhard Wicht; Steffen Paul, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/854,658

(22) Filed: May 14, 2001

(65) Prior Publication Data

US 2001/0043119 A1 Nov. 22, 2001

(30) Foreign Application Priority Data

May 12, 2000 (DE) .......................... 100 23 362

(51) Int. Cl.[7] .................................. G11C 7/00
(52) U.S. Cl. .................. 365/207; 365/106; 327/54; 327/67; 327/87
(58) Field of Search ................ 365/207, 206, 365/208, 106; 327/54, 67, 87

(56) References Cited

U.S. PATENT DOCUMENTS

| 4,464,591 | A | * | 8/1984 | Rapp | 365/208 |
| 4,553,053 | A | * | 11/1985 | Ong et al. | 365/208 |
| 5,585,746 | A | * | 12/1996 | Franke | 327/54 |
| 5,663,915 | A | * | 9/1997 | Mobley | 365/208 |
| 5,815,452 | A | * | 9/1998 | Shen | 365/207 |

FOREIGN PATENT DOCUMENTS

JP 09 172 328 A 6/1997

OTHER PUBLICATIONS

Nobutaro Shibata.: "Current Sense Amplifiers for LowVoltage Memories", IEICE Trans, Electron., vol. E79–C, No. 8, Aug. 1996, pp. 1120–1130.
Nobutaro Shibata et al.: "Megabit–Class Size–Configurable 250–MHz SRAM Macrocells with a Squashed–MemoryCell Architecture", IEICE Trans. Electron., vol. E62–C, No. 1, Jan. 1999, pp. 94–104.

* cited by examiner

*Primary Examiner*—Tan T. Nguyen
(74) *Attorney, Agent, or Firm*—Laurence A. Greenberg; Werner H. Stemer; Ralph E. Locher

(57) ABSTRACT

An amplifier circuit configuration includes a data line for transmitting a data signal. The data line is connected to a data signal input of an amplifier by way of a switching device. The amplifier includes a control circuit for controlling an input resistance of the amplifier with a terminal for a control signal. The terminal for the control signal of the control circuit is connected, parallel to the switching device, to the data line. As a consequence, a switching device, which is connected between the data line and the amplifier, has only little influence on the dynamic response when reading out a data signal.

11 Claims, 2 Drawing Sheets

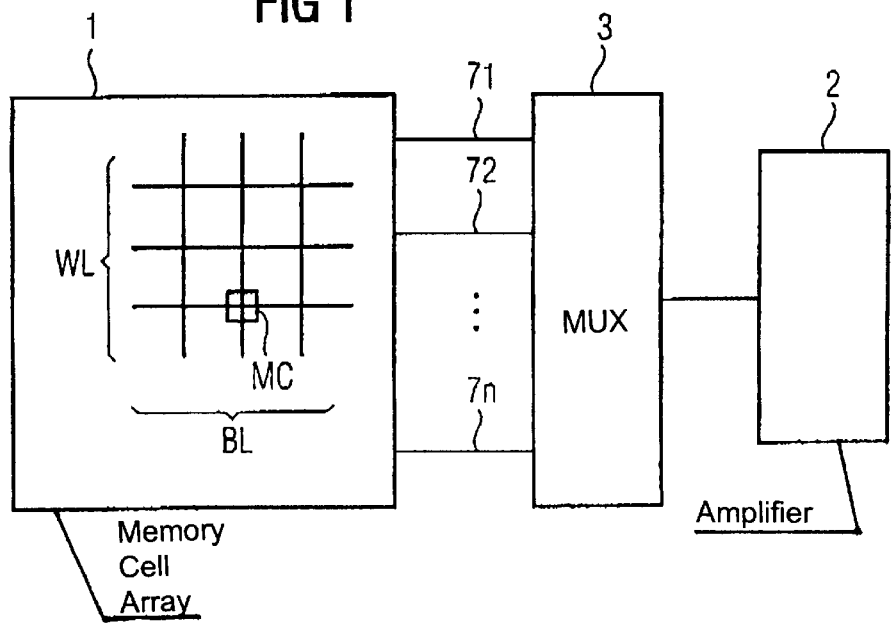
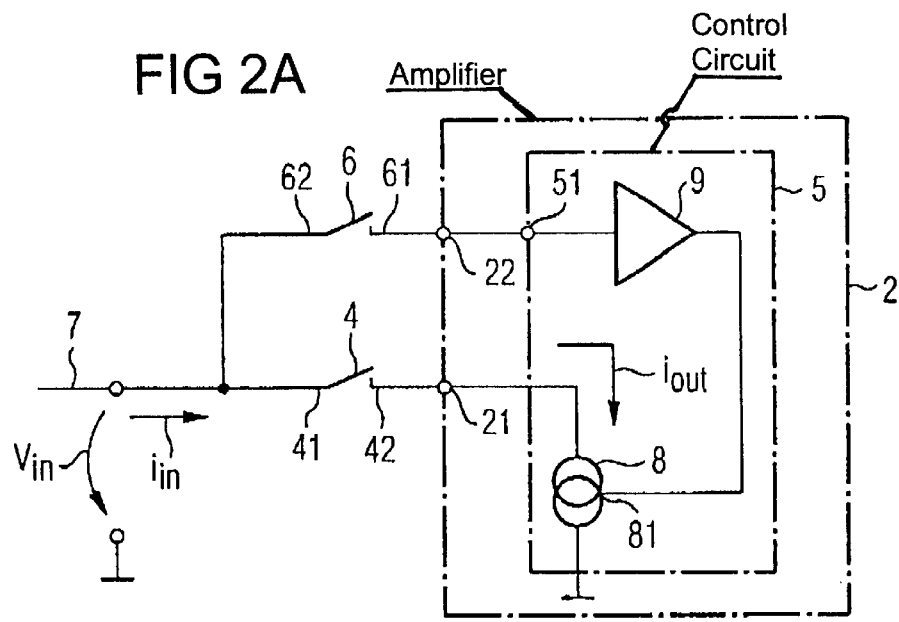
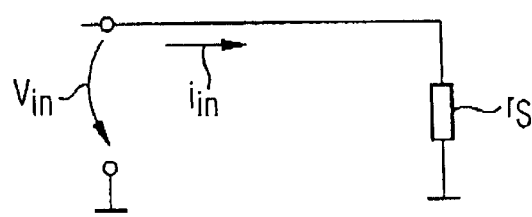

AMPLIFIER CIRCUIT

BACKGROUND OF THE INVENTION

Field of the Invention

The invention relates to an amplifier circuit configuration having a data line for transmitting a data signal, a switching device with a first terminal, which is connected to the data line, and an amplifier for detecting a current. The amplifier has a data signal input, which is connected to a second terminal of the switching device. The amplifier includes a control circuit for controlling an input resistance of the amplifier. The amplifier also has a terminal for a control signal.

To read data from an integrated semiconductor memory, for instance, amplifier circuits of various kinds are used, which are known as read amplifiers (sense amplifiers). An amplifier, i.e. a sense amplifier, is connected to a data line on which a data signal is carried for the purpose of reading the data signal. In an integrated memory having a matrix-type memory cell array in which the cells are combined into units of word lines and bit lines (i.e. row and column lines), the data line is realized as one of the bit lines. The transmitted data are detected and amplified by the read amplifier.

The data of memory cells are read out by current detection. Using the principle of current detection, the current of a memory cell is coupled out with optimally low resistance. To this end, amplifiers are typically constructed such that they have a sufficiently small input resistance. The smaller this resistance is, the less time is generally required to read the memory contents, i.e. the read time is independent upon the capacity of the connection between the memory cells and the amplifier.

A read amplifier of an SRAM (Static Random Access Memory), for instance, is usually significantly larger than the width of the memory cells. For this reason, several column lines are usually allocated to a read amplifier, a respective one of which is connected to the read amplifier by a multiplexer circuit. The multiplexer circuit, which in principle contains several switches, has a positive resistance in series with the input resistance of the read amplifier. The multiplexer circuit thus has a substantial influence on the dynamic response in the read access of the memory.

In the article "Megabit-Class Size-Configurable 250-MHz SRAM Macrocells with a Squashed-Memory-Cell Architecture," Nobutaro Shibata, Hiroshi Inokawa, Kei-ichiro Tokunaga, Soichi OHTA, IEICE Trans. Electron. Vol. E82 C, No. 1, January 1999, pp. 94–104, various configurations of multiplexer circuits and amplifiers are discussed for reducing the interfering influence of the multiplexer circuit on the dynamic response.

In the article "Current Sense Amplifiers for Low-Voltage Memories," Nobutaro Shibata, IEICE Trans. Electron. Vol. E79-C, No. 8, August 1996, pp. 1120–1130, principles and configurations of amplifiers for current detection are described. Various basic circuits of amplifiers there described include a data signal input and a control circuit for controlling the input resistance of the amplifier. An input of the control circuit is connected to the data signal input of the amplifier. This achieves a relatively low input resistance of the amplifier. However, the influence of a multiplexer circuit that is connected on the line side is not taken into account in this solution.

SUMMARY OF THE INVENTION

It is accordingly an object of the invention to provide an amplifier circuit configuration which overcomes the above-mentioned disadvantages of the heretofore-known configurations of this general type and which has an amplifier for current detection wherein the influence exerted on the dynamic response in the readout of a data signal by a switching device that is connected between the data line and amplifier, particularly a device contained in a multiplexer circuit, is relatively small.

With the foregoing and other objects in view there is provided, in accordance with the invention, an amplifier circuit configuration, including:

a data line for transmitting a data signal;

a switching device having a first terminal and a second terminal, the first terminal being connected to the data line;

an amplifier for current detection, the amplifier having a data signal input connected to the second terminal of the switching device and having an input resistance;

the amplifier including a control circuit for controlling the input resistance of the amplifier, the control circuit having a control terminal for receiving a control signal; and the control terminal of the control circuit being connected, parallel to the switching device, to the data line.

In other words, the object of the invention is achieved by an amplifier circuit configuration having a data line for carrying a data signal, a switching device with a first terminal, which is connected to the data line, and an amplifier for current detection having a data signal input which is connected to the second terminal of the switching device, wherein the amplifier includes a control circuit or regulation circuit for controlling an input resistance of the amplifier with a terminal for a control signal, the terminal for the control signal of the control circuit being connected to the data line parallel to the switching device.

The control circuit of the amplifier controls the input resistance of the amplifier so that the amplifier has a relatively low input resistance. The controlled quantity is the voltage. A low input resistance means that the input voltage varies only slightly independent of the amount of an input current. Since the resistance of the switching device, which is contained in a multiplexer circuit, for example, is in series with the input resistance of the data signal input of the amplifier, the resistance of the overall circuit configuration for reading a data signal is increased by the resistance of the switching device.

Because the terminal for the control signal of the control circuit is connected to the data line and in a manner parallel to the switching device, the voltage is tapped as controlled quantity for the control circuit upstream from the switching device. As a result, the resistance of the switching device is taken into consideration in the controlling of an input resistance of the amplifier. Consequently, the input resistance of the overall circuit configuration for reading a data signal is barely increased by the in-series resistance of the switching device. The negative influence of the switching device on the dynamic response in the readout of the data signal is thus eliminated.

According to another feature of the invention, a further switching device having a first terminal and a second terminal is provided, the second terminal of the further switching device being connected to the data line, and the control terminal of the control circuit is connected to the first terminal of the further switching device.

In other words, in an advantageous embodiment of the invention, the terminal for the control signal (control terminal) of the control circuit is connected to a terminal of an additional switching device, and a second terminal of the additional switching device is connected to the data line. The terminal for the control signal of the control circuit is thereby provided with a switching device. It is thus possible for several data lines to be allocated to the amplifier, each respective one of which is connected to the amplifier by way of a multiplexer circuit. The respective data line is connected via the switching device and the additional switching device to the data signal input of the amplifier, i.e. to the terminal for the control signal of the control circuit.

If the amplifier circuit configuration includes several data lines, the switching device and the additional switching device are contained in a multiplexer circuit. The data lines are then connected to the multiplexer circuit, and the data In signal input of the amplifier and the terminal for the control signal of the control circuit are likewise connected to the multiplexer circuit.

In a further embodiment of the amplifier, the data signal input of the amplifier is connected to a controllable current source. The terminal for the control signal (control terminal) of the control circuit is connected to an input of the amplifier circuit, and an output of the amplifier circuit is connected to a control terminal of the current source. The amplifier circuit is suitable for voltage measurement and voltage amplification, for example. A high-resistance (high impedance) tapping is thus accomplished at the terminal for the control signal of the control circuit. The additional switching device, which is connected at the terminal for the control signal of the control circuit, can thus likewise be constructed to have a relatively high resistance. If the additional switching device is constructed as a transistor, this transistor can be constructed with a relatively small area.

Since the terminal for the control signal of the control circuit is connected to the data line, the control of the amplifier acts directly on the data line. Thus, the circuit characteristics of the amplifier circuit configuration are less sensitive to variations in the production process and temperature fluctuations.

The amplifier circuit configuration according to the invention can advantageously be used to read a data signal of a memory cell of an integrated semiconductor memory. To this end, the data line is connected to a terminal for a read signal of a memory cell of the integrated memory. The integrated memory is constructed as what is known as an SRAM, a ROM (Read-Only Memory), or a DRAM (Dynamic Random Access Memory). If the integrated memory includes a matrix-shaped memory cell array wherein the memory cells are combined into units of word lines and bit lines, the data line is constructed as one of the bit lines. In another embodiment, the data line is connected to the terminal for a read signal of a photocell of a photocell matrix.

According to another feature of the invention, the controllable current source includes a transistor having a transistor control terminal and a controlled path, the controlled path of the transistor is connected to the data signal input of the amplifier, and the current source control terminal is connected to the transistor control terminal.

According to yet another feature of the invention, the data line and the further data lines are respectively combined into pairs of data lines carrying complementary signals.

According to a further feature of the invention, the amplifier circuit includes a non-inverting amplifier, and the transistor is configured as an n-channel MOS transistor.

According to yet a further feature of the invention, a read signal terminal for a memory cell in an integrated memory is provided, and the data line is connected to the read signal terminal. Also, a read signal terminal for a photo cell in a photo cell matrix may be provided, and the data line is then connected to the read signal terminal.

With the objects of the invention in view there is also provided, a memory configuration, including:

an integrated memory having a memory cell and a read signal terminal for the memory cell;

a data line connected to the read signal terminal;

a switching device having a first terminal and a second terminal, the first terminal being connected to the data line;

an amplifier for current detection, the amplifier having a data signal input connected to the second terminal of the switching device and having an input resistance;

the amplifier including a control circuit for controlling the input resistance of the amplifier, the control circuit having a control terminal for receiving a control signal; and the control terminal of the control circuit being connected, parallel to the switching device, to the data line.

With the objects of the invention in view there is also provided, a photo cell configuration, including:

a photo cell matrix having a photo cell and a read signal terminal for the photo cell;

a data line connected to the read signal terminal;

a switching device having a first terminal and a second terminal, the first terminal being connected to the data line;

an amplifier for current detection, the amplifier having a data signal input connected to the second terminal of the switching device and having an input resistance;

the amplifier including a control circuit for controlling the input resistance of the amplifier, the control circuit having a control terminal for receiving a control signal; and the control terminal of the control circuit being connected, parallel to the switching device, to the data line.

Other features which are considered as characteristic for the invention are set forth in the appended claims.

Although the invention is illustrated and described herein as embodied in an amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of an integrated memory with a memory cell array, a multiplexer circuit, and a read amplifier;

FIG. 2A is a schematic circuit diagram of an exemplary embodiment of the invention;

FIG. 2B is a schematic circuit diagram illustrating the input resistance present at the input of the data line;

DESCRIPTION OF THE PREFERRED EMBODIMENTS

Figure 3:
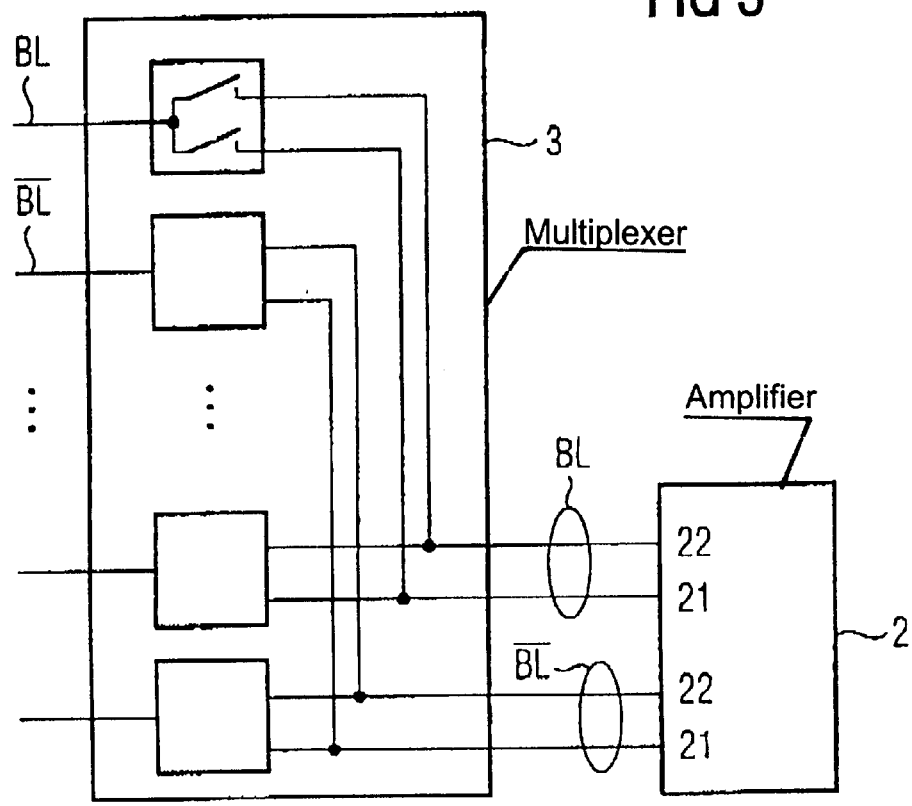
FIG. 3 is a schematic circuit diagram of a circuit configuration for reading bit line pairs of an integrated memory.

Referring now to the figures of the drawings in detail and first, particularly, to FIG. 1 thereof, there is shown a circuit configuration of an integrated memory including a memory cell array 1, a multiplexer 3, and an amplifier or read amplifier 2. This configuration may also be embodied as photodiodes in which the current of one of the pixels must be read.

The memory cell array 1 is provided in the form of a matrix; the memory cells MC are combined into units of word lines WL and bit lines BL. The memory cells MC of the memory represented here, e.g. an SRAM, each contain a select transistor and two feedback inverters. Control inputs of the selection transistors are connected to one of the word lines WL, while a main current path of the selection transistors is provided between an inverter input of the respective memory cell MC and one of the bit lines BL.

Data lines 71, 72 . . . 7n of the memory cell field 1 are connected to a multiplexer circuit 3. The data lines 71 to 7n are constructed as bit lines BL. Several bit lines BL and data lines 71 to 7n are allocated to the read amplifier 2. Each of the lines is connected to the read amplifier 2 by way of the multiplexer circuit 3. The data lines 71 to 7n serve to carry a data signal of one of the memory cells MC.

FIG. 2A shows an embodiment of the amplifier circuit configuration according to the invention with a data line 7 and an amplifier 2 or read amplifier 2, for detecting the current of a data signal on the data line 7. A switching device 4 includes a first terminal 41, which is connected to the data line 7. The read amplifier 2 includes a data signal input 21, which is connected to a terminal 42 of the switching device 4. The read amplifier 2 also includes a control circuit 5 having a terminal 51 for a control signal, which his connected to a control input 22 of the read amplifier 2. The control circuit 5 serves to control an input resistance $r_s$ at the terminal of the data line 7. This input resistance $r_s$ is schematically represented in an equivalent circuit diagram in FIG. 2B.

In the embodiment according to FIG. 2A, the terminal 51 for the control signal is connected to the data line 7 parallel to the switching device 4 by way of an additional switching device 6. A first terminal 61 of the additional switching device 6 is connected to the terminal 51 for the control signal, and a second terminal 62 of the switching device 6 is connected to the data line 7.

To realize a circuit configuration with a low input resistance $r_s$, the principle of negative feedback is applied. An input current $i_{IN}$ countered on the data line 7 by a negative feedback current of the same magnitude $i_{OUT}$. The controlled variable is thus the input voltage $V_{IN}$; i.e. this determines the amount of the negative feedback current $i_{OUT}$.

Consequently, the input voltage $V_{IN}$ varies only slightly, independent of the magnitude of the input current $i_{IN}$. Thus, the circuit has a relatively low input resistance $r_s$. Since the voltage that must be regulated is tapped by the control circuit 5 at the data line 7 upstream from the switching device 4, the through-resistance or transit resistance of the switching device 4 is factored into the controlling of the control circuit 5. The influence of the switching device 4 is thus eliminated.

To allow a connecting of the read amplifier 2 to a plurality of data lines, additional switching devices 6 must be provided. A multiplexer function can thus be realized, i.e. the read amplifier 2 can be allocated to a plurality of data lines 7.

The data signal input 21 of the read amplifier 2 is connected to a controllable current source 8. The control input 22 of the read amplifier 2 or the terminal 51 for the control signal, is connected to an input of an amplifier circuit 9, and an output of the amplifier circuit 9 is connected to a control terminal 81 of the current source 8. The amplifier circuit 9 is suitable for measuring and amplifying voltage. This means that a relatively small current load arises at the switching device 6 due to a high-resistance tap at the data line 7. The switching device 6 can thus be realized with relatively high resistance, whereby an area reduction can be realized in the construction of the switching device 6. The input of the read amplifier 2 is thus divided into a relatively low-resistance input 21 for the data signal and a relatively high-resistance input 22 for the measuring and control signal.

Since the control input 22 of the read amplifier 2 is connected directly to the data line 7 (by way of the switching device 6 in the example), the sensitivity of the circuit characteristics to variations in the production process and temperature fluctuations is expediently reduced.

Figure 4:
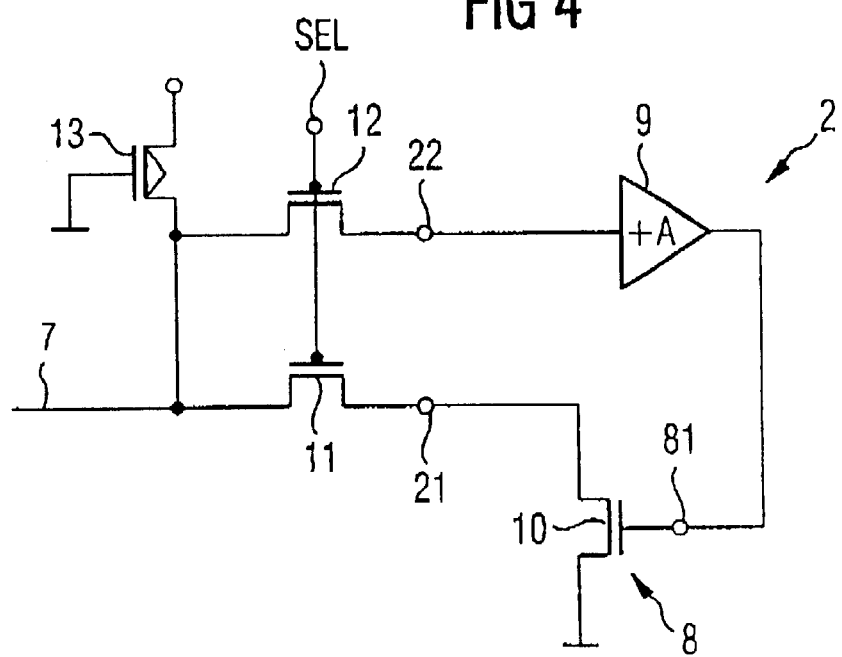
FIG. 4 is a detailed schematic circuit diagram of an embodiment of the amplifier circuit configuration according to the invention.

FIG. 4 shows a detailed representation of an embodiment of the inventive amplifier circuit configuration. The controllable current source 8 includes a transistor 10, whose controlled path (control loop) is connected to the data signal input 21 of the read amplifier 2. The control terminal 81 of the current source 8 is thus connected to the control terminal of the transistor 10 and the output of the amplifier circuit 9. The amplifier circuit 9 is constructed as a non-inverting amplifier; the transistor 10 is constructed as an n-channel MOS transistor. The two transistors 11 and 12 serve as switching devices. They are controlled by way of the signal SEL, for instance of a multiplexer circuit. A p-channel transistor 13 delivers the working-point current and simultaneously serves to precharge the data line 7. The data line 7 is one of the bit lines BL of the memory cell array 1 from FIG. 1. The transistor 12 can be constructed with relatively high resistance. With respect to area, the transistor 12 can thus be dimensioned substantially smaller than the transistor 11. Thus, the space requirements are not appreciably increased by the transistor 12.

FIG. 3 shows a circuit configuration having several data lines, which are combined into pairs of bit lines BL and $\overline{BL}$ that carry complementary signals. Accordingly, the read amplifier 2 includes a data signal input 21 and respectively a control input 22 for the bit line BL and for the complementary bit line $\overline{BL}$, respectively. The switching devices 4 and 6 from FIG. 2A are each included in the multiplexer circuit 3 for one of the bit lines BL or $\overline{BL}$.

We claim:

1. An amplifier circuit configuration, comprising:

a data line for transmitting a data signal;

a switching device having a first terminal and a second terminal, said first terminal being connected to said data line;

an amplifier for current detection, said amplifier having a data signal input connected to said second terminal of said switching device and having an input resistance;

said amplifier including a control circuit for controlling said input resistance of said amplifier, said control circuit having a control terminal for receiving a control signal; and said control terminal of said control circuit being connected, parallel to said switching device, to said data line.

2. The amplifier circuit configuration according to claim 1, including:
- a further switching device having a first terminal and a second terminal, said second terminal of said further switching device being connected to said data line; and
- said control terminal of said control circuit being connected to said first terminal of said further switching device.

3. The amplifier circuit configuration according to claim 2, including:
- further data lines;
- a multiplexer circuit, said switching device and said further switching device being included in said multiplexer circuit;
- said data line and said further data lines being connected to said multiplexer circuit; and
- said data signal input of said amplifier and said control terminal of said control circuit being connected to said multiplexer circuit.

4. The amplifier circuit configuration according to claim 3, wherein said data line and said further data lines are respectively combined into pairs of data lines carrying complementary signals.

5. The amplifier circuit configuration according to claim 1, including:
- a controllable current source connected to said data signal input of said amplifier, said controllable current source having a current source control terminal;
- an amplifier circuit having an input and an output;
- said control terminal of said control circuit being connected to said input of said amplifier circuit; and
- said output of said amplifier circuit being connected to said current source control terminal.

6. The amplifier circuit configuration according to claim 5, wherein:
- said controllable current source includes a transistor having a transistor control terminal and a controlled path, said controlled path of said transistor is connected to said data signal input of said amplifier; and
- said current source control terminal is connected to said transistor control terminal.

7. The amplifier circuit configuration according to claim 6, wherein:
- said amplifier circuit includes a non-inverting amplifier; and
- said transistor is configured as an n-channel MOS transistor.

8. The amplifier circuit according to claim 1, including:
- a read signal terminal for a memory cell in an integrated memory; and
- said data line being connected to said read signal terminal.

9. The amplifier circuit configuration according to claim 1, including:
- a read signal terminal for a photo cell in a photo cell matrix; and
- said data line being connected to said read signal terminal.

10. A memory configuration, comprising:
- an integrated memory having a memory cell and a read signal terminal for said memory cell;
- a data line connected to said read signal terminal;
- a switching device having a first terminal and a second terminal, said first terminal being connected to said data line;
- an amplifier for current detection, said amplifier having a data signal input connected to said second terminal of said switching device and having an input resistance;
- said amplifier including a control circuit for controlling said input resistance of said amplifier, said control circuit having a control terminal for receiving a control signal; and
- said control terminal of said control circuit being connected, parallel to said switching device, to said data line.

11. A photo cell configuration, comprising:
- a photo cell matrix having a photo cell and a read signal terminal for said photo cell;
- a data line connected to said read signal terminal;
- a switching device having a first terminal and a second terminal, said first terminal being connected to said data line;
- an amplifier for current detection, said amplifier having a data signal input connected to said second terminal of said switching device and having an input resistance;
- said amplifier including a control circuit for controlling said input resistance of said amplifier, said control circuit having a control terminal for receiving a control signal; and
- said control terminal of said control circuit being connected, parallel to said switching device, to said data line.

* * * * *